United States Patent [19]

Rapp

[11] Patent Number: 4,464,591
[45] Date of Patent: Aug. 7, 1984

[54] CURRENT DIFFERENCE SENSE AMPLIFIER

[75] Inventor: A. Karl Rapp, Los Gatos, Calif.

[73] Assignee: National Semiconductor Corporation, Santa Clara, Calif.

[21] Appl. No.: 391,255

[22] Filed: Jun. 23, 1982

[51] Int. Cl.³ .................... G01R 19/165; H03K 5/24; G11C 7/06
[52] U.S. Cl. .................... 307/530; 307/362; 330/288; 365/208
[58] Field of Search ............... 307/362, 491, 493, 501, 307/530; 330/253, 288, 277; 365/207, 208, 205

[56] References Cited

U.S. PATENT DOCUMENTS

| | | | |
|---|---|---|---|
| 3,648,071 | 3/1972 | Mrazek | 307/530 |
| 4,060,740 | 11/1977 | Nishimura | 307/530 |
| 4,348,601 | 9/1982 | Kitamura | 307/530 |
| 4,355,247 | 10/1982 | Marmet | 307/530 |
| 4,388,539 | 6/1983 | Boeke | 307/491 |
| 4,388,541 | 6/1983 | Giebel | 307/530 |

OTHER PUBLICATIONS

Wong et al., "A 45ns Fully-Static 16K MOS ROM"; 1981 *IEEE Int'l. Solid-State Circuits Conf.*; Sess: XII: Memory Techniques; 2/19/81; pp. 150–151, *Digest of Technical Papers.*

*Primary Examiner*—Larry N. Anagnos
*Attorney, Agent, or Firm*—Gail W. Woodward; Paul J. Winters; Michael J. Pollock

[57] ABSTRACT

A differential current sense amplifier is shown suitable for high speed semiconductor memory sensing. A reference current generation circuit is also developed for operating a plurality of sense amplifiers.

10 Claims, 4 Drawing Figures

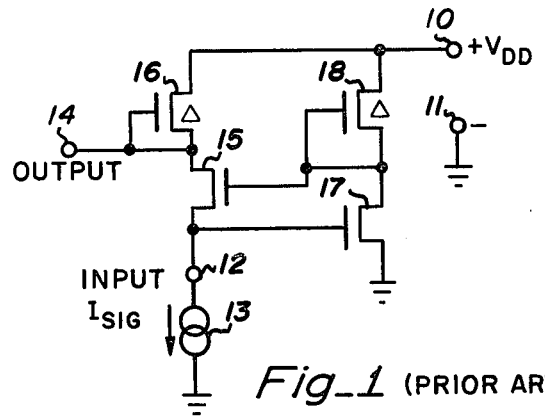
Fig_1 (PRIOR ART)
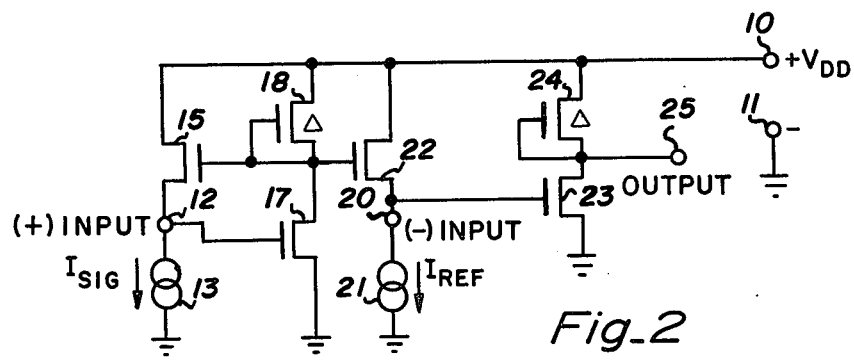
Fig_2
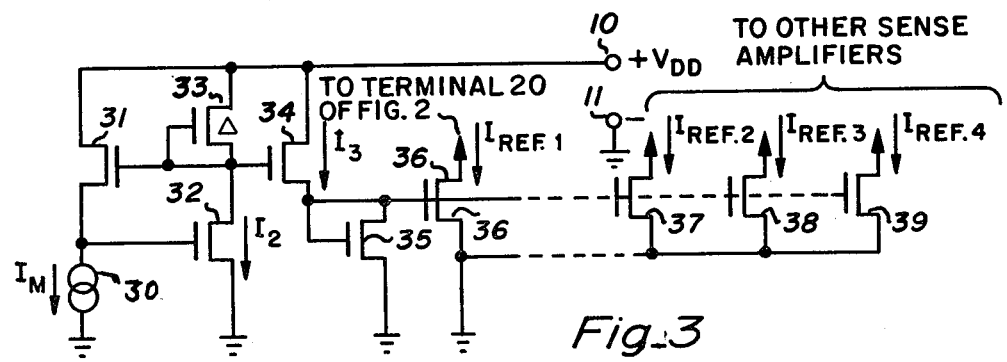
Fig_3
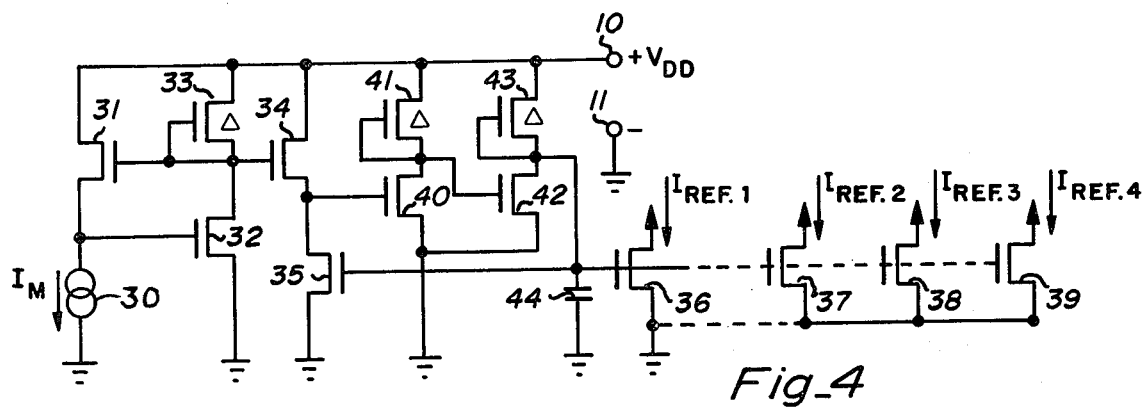
Fig_4

CURRENT DIFFERENCE SENSE AMPLIFIER

BACKGROUND OF THE INVENTION

Semiconductor memory devices employ an array of memory cells arranged in columns and rows to cover an area of an integrated circuit (IC) chip. The cells are addressed by means of decoder circuitry that select the cell to be addressed and its memory content read out by way of a sense amplifier. When an array is made very large, the stray capacitance of the circuits becomes large. When a voltage responsive sense amplifier arrangement is employed, a large array entails the charging and discharging of a relatively large shunt capacitance and the speed of response is slowed. However, if the sense amplifier is made responsive to the memory array current, and the voltage swings reduced to a small value, the large capacitance of a large array does not limit the speed of response. Accordingly, it is desirable to employ reduced voltage swing current sensing amplifiers. In particular, a differential current sense amplifier is desired in which a reference current is compared with the memory current and an output voltage generated to indicate the comparison.

SUMMARY OF THE INVENTION

It is an object of the invention to produce a differential current sensing amplifier with a voltage output representative of the current differential.

It is a further object of the invention to develop a reference current and apply it to one input of a differential sense amplifier which has its other input coupled to a memory current to be sensed.

It is a still further object of the invention to develop a plural current reference current source for providing reference currents to a plurality of differential current sense amplifiers suitable for use on an IC memory chip.

These and other objects are achieved as follows. As input transistor, connected as a common source stage, is coupled to respond to the current in a memory element. The input stage includes a common source amplifier transistor with a depletion load transistor forming an inverter. The inverter input gate is directly coupled to the source of a common drain connected transistor, and its output coupled to the common drain transistor gate. The input stage acts as an inverting amplifier that provides negative feedback around the common drain stage. As a result, the bias is stabilized so that the common drain transistor source is clamped close to one threshold above ground and its gate is clamped close to two thresholds above ground. When the memory element contains a "zero", no current flows in the common drain transistor.

When memory current is present for a logic "one", the current will flow in the common drain transistor. The difference between these two states will produce only a small input voltage shift so that memory reading speed is not slowed by the charge and discharge associated with the inevitable shunt capacitance. A reference input source follower transistor has its gate coupled to the gate of the common drain transistor. The source of the reference input transistor is coupled to a reference current and to an amplifying inverter, the output of which will develop large voltage swings which indicate the state of the memory element current being read relative to the reference current.

The reference current is made a controlled fraction of the memory current to be sensed. This can be done using a circuit similar to that of the sense amplifier modified to include a current mirror coupled in place of the output inverter. If desired, the current mirror can include a series of coupled transistors each feeding a separate current sense amplifier. In this circuit the above-mentioned fraction can be determined by simple geometric ratios and is therefore not sensitive to manufacturing variables. If desired, the current mirror can further include a high gain amplifier for increased accuracy.

BRIEF DESCRIPTION OF THE DRAWING

FIG. 1 is a schematic diagram of a typical prior art current sense amplifier.

FIG. 2 is a schematic diagram of the differential current sense amplifier of the invention.

FIG. 3 is a schematic diagram of a reference current source circuit suitable for supplying reference currents to a plurality of sense amplifiers.

FIG. 4 is a schematic diagram of an alternative reference current circuit.

DESCRIPTION OF THE PRIOR ART

FIG. 1 is a schematic diagram of a prior art current-mode memory sense amplifier. The circuit is made up of N channel transistors powered from a $V_{DD}$ power supply connected positive to terminal 10 and negative to ground terminal 11. The amplifier has an input terminal 12 which is indicated as driven with $I_{SIG}$ in current sink 13. Current sink 13 represents the current being sensed in a memory array. Output terminal 14 provides the amplifier output to succeeding circuitry. Transistor 17, connected as a common source inverting stage, with depletion load transistor 18, is directly driven from input terminal 12. The inverting stage output is directly coupled to the gate of transistor 15, the source of which is coupled back to input terminal 12. Thus inverter 17 provides a negative feedback loop around the transistor 15 gate to source circuit so as to stabilize its bias.

With $I_{SIG}$ at zero, transistor 15 will pull terminal 12 up and turn on transistor 17 which will pull the gate of transistor 15, along with its source, down and stabilize the circuit operating point at that level where transistor 15 is biased just at its cutoff. At this point the voltage drop across transistor 18 due to the current in transistor 17 will seek the level of cutoff of transistor 15 just described. Thus for the zero current input, transistor 17 is conducting and transistor 15 is cut off. In this state the drain of transistor 15 will be close to $+V_{DD}$ by virtue of load transistor 16.

When $I_{SIG}$ is at a logic "one," or typically about fifty microamperes, terminal 12 will be pulled down slightly thereby reducing the current in transistor 17. Thus, the drain of transistor 17 will rise so as to turn transistor 15 on sufficiently to conduct $I_{SIG}$. Since only fifty microamperes need be conducted in transistor 15 the rise of its gate voltage is relatively small. Since transistor 17 acts as an amplifying inverter the voltage shift between the source and gate of transistor 15 will be considerably larger than the shift in gate voltage on transistor 17. Typically a shift of about 20 millivolts at terminal 12 will be encountered.

In the logic "one" state, the 50 microamperes will flow through depletion load transistor 16 so that the voltage at terminal 14 will be at some intermediate voltage level below $+V_{DD}$. If depletion load transistor 16 has a relatively large resistance when conducting, it will develop a substantial signal swing at output terminal 14. However, if the resistance of load transistor 16 is increased to provide a large signal swing output, it will slow down the voltage transition going from a "1" to "0". This occurs because any capacitance to ground at terminal 14 must be charged through transistor 16. Clearly selecting the value of resistance for transistor 16 produces a performance compromise. It would therefore be desirable to eliminate transistor 16.

DESCRIPTION OF THE INVENTION

FIG. 2 shows the circuit of the invention in schematic diagram form. The circuit shown is actually a differential current to voltage amplifier. $I_{SIG}$ is coupled to the noninverting input at terminal 12 and this is compared with $I_{REF}$ which is coupled to inverting input 20. It will be noted that load transistor 16 of FIG. 1 has been eliminated and the drain of transistor 15 returned directly to $+V_{DD}$.

The negative feedback loop completed by common source inverting transistor 17, with its depletion load transistor 18, couples the source of transistor 15 back to its gate. Thus, transistor 15 represents a close to unity gain source follower in which the gate to source potential of the device will adjust itself to accommodate the current flowing as $I_{SIG}$ at terminal 12. As pointed out above, the voltage swing at the gate of transistor 17 will be quite small when $I_{SIG}$ swings from 0 to 50 microamperes. The gate to source voltage swing on transistor 15, while greater than that of transistor 17, will still be relatively small. The gate of enhancement transistor 15 is directly coupled to the gate of enhancement transistor 22 which operates as a unity gain source follower due to the presence of $I_{REF}$ flowing in current sink 21. If transistors 15 and 22 are matched, and $I_{SIG}=I_{REF}$, the potential at terminal 20 will equal the potential at terminal 12. Since the gate of transistor 23 is directly coupled to the source of transistor 22, it will act as a high gain inverting amplifier with its depletion load transistor 24. Thus, even though the voltage swing at terminal 20 is small as $I_{SIG}$ changes, the output signal swing at terminal 25 can be substantial.

It can be seen that if transistors 15 and 22 are matched, transistors 17 and 23 matched, and loads 18 and 24 are matched, the circuit trip point will be where $I_{SIG}=I_{REF}$. For this condition the circuit is active and at its maximum gain state.

As a practical matter, $I_{REF}$ is preferred to be set between $\frac{1}{4}$ and $\frac{1}{2}$ of the $I_{SIG}$ value. This means that typically $I_{REF}$ will be between 12.5 and 25 microamperes (16 microamperes would be a good compromise value). In operation, when $I_{SIG}$ is at logic "0", $I_{REF}$ will dominate and terminal 25 will be high or close to $+V_{DD}$. When $I_{SIG}$ is at logic "1" it will dominate and output terminal 25 will be low or close to ground. The circuit will display maximum gain in the transition state where $I_{SIG}$ equals $I_{REF}$. It is to be noted that while a 50 microampere signal is preferred, the circuit will function well at a 10 microampere level.

Where the sense amplifier of FIG. 2 is used in a semiconductor memory chip, there will ordinarily be a plurality of such circuits repeated as often as needed for the particular architecture being employed. In this situation a single $I_{REF}$ generator would be employed to provide a plurality of current sinks, one for each amplifier. FIG. 3 shows such a circuit.

Current sink 30 produces a current $I_M$ that represents a pseudo value related to the $I_{SIG}$ memory current detailed in FIGS. 1 and 2. It will typically be developed in a dummy memory cell programmed for a logic "one". $I_M$ flows in transistor 31 because transistor 32, operating as an inverting amplifier, with its depletion load 33, provides negative feedback from the source of transistor 31 back to its gate. The drain of transistor 32 is directly coupled to the gate of transistor 34 which acts as a source follower to pass current $I_3$ through transistor 35 which has its gate returned back to its drain. Transistor 35 acts as a current mirror with transistors 36–39 which provide the individual reference currents to the individual sense amplifiers. If transistors 35–39 are all of the same size, current $I_3$ will be mirrored at $I_{REF1}$, $I_{REF2}$, $I_{REF3}$, $I_{REF4}$, and so forth, for all of the current sink transistors coupled to transistor 35. Thus, as many current sinks as needed can be slaved to the circuit of FIG. 3. In this circuit, desirably $I_2$ and $I_3$ are made to obey the relationship:

$$\left(\frac{I_3}{W_{35}/L_{35}}\right) = \left(\frac{I_2}{W_{32}/L_{32}}\right)$$

where the width to length ratios are associated with designated transistors, $I_2$ is the current in transistor 32, and $I_3$ is the current in transistor 35.

If it is desired to obtain a reference current that is a fraction of $I_M$, transistors 36–39 would have their W/L ratios adjusted to be that fraction of the W/L ratio of transistor 35.

In the circuit of FIG. 4, the current in transistor 35 is forced to match $I_M$ because the drain of transistor 35 is coupled back to its gate by way of a high gain noninverting amplifier. Common source transistor 40, with its depletion load transistor 41, drives the gate of common source transistor 42 which has a depletion load transistor 43. The cascaded inverters, therefore, complete a high gain negative feedback loop around the drain to gate path of transistor 35. Capacitor 44 is included to frequency compensate the circuit by rolling off the circuit gain at high frequencies in the conventional manner. Transistors 36–39 will mirror the current in transistor 35 as in the case of the FIG. 3 circuit. As a practical matter all or part of the capacitance of capacitor 44 could be obtained by the stray capacitance represented by the interconnected gates.

The invention has been described so that a person skilled in the art can practice it. Upon reading the foregoing description there will occur alternatives and equivalents that are within the spirit and intent of the invention. Accordingly, it is intended that the scope of the invention be limited only the following claims.

I claim:

1. A differential current sensing amplifier circuit having a current sense input; a reference current input and and an output, said circuit comprising:

a first terminal comprising said current sense input;

a second terminal comprising said reference current input;

means for providing a reference current at said second terminal;

a first field effect transistor (FET) common drain amplifier stage having an output coupled to said first terminal and an input;

a first FET inverting amplifier stage having a input coupled to said first terminal and an output coupled to said input of said FET common drain amplifier stage;

a second FET common drain amplifier stage having an input coupled to said output of said first FET inverting amplifier stage and an output coupled to said second terminal; and a second FET inverting amplifier stage having an input coupled to said second terminal and an output providing said sensing amplifier circuit output whereby said circuit output goes low when said current sense input exceeds said reference current and that goes high when said current sense input is lower than said reference current.

2. The circuit of claim 1 wherein said first and second inverting amplifier stages each comprise a common source FET and a depletion load FET.

3. The circuit of claim 2 wherein said first and second common drain stages and said first and second inverting amplifier stages comprise enhancement FETS.

4. The circuit of claim 1 including means for providing said reference current at a level that is a controlled fraction of the current to be sensed.

5. The circuit of claim 4 wherein said fraction is in the range of $\frac{1}{2}$ to $\frac{1}{4}$.

6. The circuit of claim 4 wherein said means for providing said reference current comprises:

a source of simulated memory current;

a third common drain FET amplifier stage having its output connected to said source of simulated memory current, and an input;

a third inverting FET ammplifier stage having its input coupled to said output of said third common drain FET amplifier stage and its output coupled to said input of said third common drain FET amplifier stage;

a fourth common drain FET amplifier stage having an input coupled to said output of said third inverting FET amplifier stage and an output; and current mirror means coupled to said output of said fourth common drain FET amplifier stage whereby said current mirror means produces a current reference output.

7. The circuit of claim 6 wherein the geometry of said third inverting FET amplifier stage and said current mirror means are ratioed to produce equality between said reference current and said simulated memory current.

8. The circuit of claim 6 wherein said current mirror means includes a common source enhancement FET with its gate coupled to its drain and to the gate of a current sink FET which acts as the output stage of said means for generating said reference current.

9. The circuit of claim 8 wherein said common source current mirror enhancement FET gate is coupled to its drain by means of an interposed buffer amplifier to force equality between said reference current and said simulated memory current.

10. The circuit of claim 9 wherein said buffer amplifier includes frequency compensation that reduces its gain as a function of increasing frequency.

* * * * *